United States Patent

[11] 3,602,841

[72] Inventor James C. McGroddy
Putnam Valley, N.Y.
[21] Appl. No. 47,486
[22] Filed June 18, 1970
[45] Patented Aug. 31, 1971
[73] Assignee International Business Machines Corporation
Armonk, N.Y.

[54] HIGH FREQUENCY BULK SEMICONDUCTOR AMPLIFIERS AND OSCILLATORS
12 Claims, 7 Drawing Figs.

[52] U.S. Cl. .......... 331/107 G, 317/234 V, 330/5
[51] Int. Cl. .......... H03b 5/12
[50] Field of Search .......... 331/107, 107 G; 317/234–10; 330/5

[56] References Cited
UNITED STATES PATENTS
3,490,051 1/1970 Hakki et al. .......... 331/107 G

*Primary Examiner*—John Kominski
*Attorneys*—Hanifin and Jancin and Hansel L. McGee

ABSTRACT: Stable high frequency oscillating and amplifying devices are prepared from bulk semiconductor materials which have a positive differential conductivity at relatively low frequencies and a negative differential conductivity in some ranges of relatively high frequencies. The materials used are further characterized in that there is charge carrier transfer or population redistribution from a lower mobility band or low mobility impurity level to a higher mobility band, an effect opposite to that of Gunn effect devices. Materials suitable for the devices of this invention may be selected from a representative group of suitably doped III-V compounds, for example, N-type InSb, N-type alloys of the form $In_xGa_{11x}As$, where $0.53<x<1.0$, $InAs_xP_{11x}$, where $0.30<x<1.0$, $In_xAl_{11x}Sb$ where $0.9<x\leq 1.0$, stressed N-type germanium, or stressed P-type germanium and silicon.

INVENTOR
JAMES C. McGRODDY

BY Hansel L. McGee
ATTORNEY

HIGH FREQUENCY BULK SEMICONDUCTOR AMPLIFIERS AND OSCILLATORS

BACKGROUND OF THE INVENTION

In U.S. Pat. No. 3,365,583 to J. B. Gunn, filed on June 12, 1964 and assigned to a common assignee, there is described a novel oscillating device which utilizes a bulk semiconductor material having a conduction band with two minima separated by only a small energy difference. Thus, when a high intensity electric field is applied to the bulk material, charge carriers gain energy from the field and are transferred to the upper minimum where they will have a lower mobility; the materials then exhibit a negative differential conductivity (NDC). In this mode of operation high field domains are formed within the bulk material and moves from the negative electrode toward the positive electrode. As a result of these high field domains, or traveling domains as they are commonly called, oscillations occur within the material. At sufficiently high frequencies, the electrons are not instantaneous responsive to the electric field variations. This delay in the response limits the frequency at which the Gunn effect can be used to provide amplification and oscillation. That is, at high frequencies the effective differential conductivity is positive.

B. W. Hakki, et al., in U.S. Pat. No. 3,490,051, filed Apr. 19, 1967 provides a bulk amplifier in which the electric field intensity is maintained at some value below the threshold required for establishing traveling domains. The Hakki, et al. patent requires that the bulk semiconductor be chosen such that the two energy bands thereof are separated by a sufficiently small energy level so that the population redistribution can take place at field intensities, as not to be destructive of the material; that at zero field intensities the carrier concentration in the lower energy band is at least ten times that in the upper energy band at the temperature of operation; and that the mobility of carriers in the lower energy band is more than approximately five times greater than the mobility in the upper band energy. The devices are biased in the range of 3,100 to 4,000 V/cm. The device is limited as to the range of frequencies at which it may oscillate or amplify since like the Gunn device, is made of a material which has negative differential conductivity at low frequencies and has a positive differential conductivity at some ranges of frequencies at which the devices do not work.

SUMMARY OF THE INVENTION

The invention lies in the discovery of a new type of high frequency bulk negative differential conductivity device in a system of "hot" electrons or holes. In this new effect, the differential conductivity occurs due to transfer of electrons from lower mobility to higher mobility states, or from states in which the electrons are not free to carry current into current carrying states, for example, the noncurrent carrying states could be the valence band or localized impurity levels, and the current carrying states could be the lowest conduction band minimum. This provides a differential conductivity which is positive at low frequencies, only becoming negative at high frequencies. The device comprises a uniform conducting solid in which there is a strong steady electric field $E_0$ on which is superimposed a weak, spatially uniform alternating field, $E_1(t) = E_1 \cos \omega t$. The current which flows in response to this small alternating field will be of the form:

$$j_1(t) = j_1^r \cos\omega t + j_1^i \sin\omega t$$

The ratio of $j_1^r$ to $\epsilon_1$ is called the real part of the differential conductivity at frequency $\omega$, denoted $\sigma_r'(\omega)$. The ratio of the out of phase current of $j_1^i$ to $\epsilon_1$ is called the imaginary part of the differential conductivity at frequency $\omega$, denoted $\sigma_i'(\omega)$. It is the sign of $\sigma_r'(\omega)$ which determines whether amplification and oscillation can be obtained. If $\sigma_r'(\omega)$ is negative, that is the in-phase current density flows opposite to the direction of the field which produces it, amplification will result. On the other hand, if $\sigma_r'(\omega)$ is positive, attenuation will result. The devices of the present invention have the properties that for a certain range of steady bias field $E_0$. $\sigma_r'(\omega)$ is positive at low frequencies but for some range of high frequencies $\sigma_r'(\omega)$ becomes less than zero, thus providing amplification and oscillation.

In accordance with the invention, a direct current electric field is applied between ohmic contacts on the opposite side of a bar of appropriate semiconductor material. The semiconductor device will exhibit positive conductance for a range of frequencies up to about $2\pi \times 10^9$ radians/sec and would be inoperative. At higher frequencies the device will exhibit negative conductance at which time amplification will occur. The amplifying device can also be used to generate oscillations in an appropriate oscillator circuit.

OBJECTS OF THE INVENTION

It is therefore, an object of the invention to provide a novel high frequency bulk semiconductor device.

Another object of the invention is to provide a novel high frequency bulk semiconductor device which operates at frequencies above the critical frequencies of Gunn effect devices.

DESCRIPTION OF THE DRAWINGS

These and other objects and features of the invention will be better understood from a consideration of the following detailed description and the accompanying drawings, in which.

DETAILED DESCRIPTION

Figure 1:
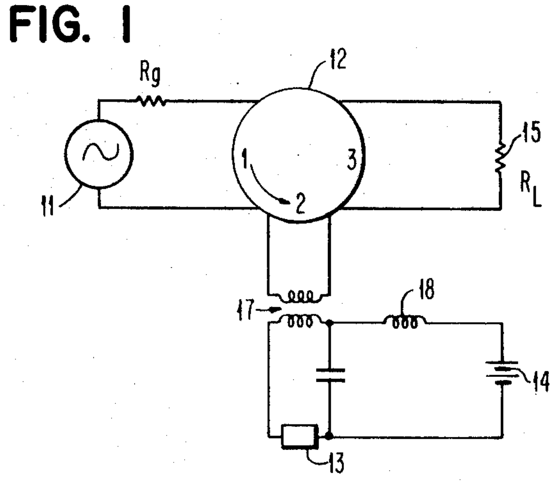
FIG. 1 is a schematic view of an amplifier circuit including a bulk semiconductor amplifier device in accordance with one embodiment of the invention.

Referring now to FIG. 1 there is shown schematically an amplifier circuit comprising a microwave signal source 11, a circulator 12, a bulk semiconductor amplifying device 13, a direct current voltage force 14 and a load 15 having a load resistance $R_L$. The signal source 11 is connected to the first port of the circulator and is coupled to the semiconductor by way of port 2 of the circulator and a transformer 17. In addition to the signal voltage a direct current voltage is applied across a semiconductor by voltage force 14. The transformer 17 blocks direct current flow to the circulator while a radio frequency choke 18 blocks microwave current to the direct current voltage force 14. The signal force is amplified by the bulk semiconductor device 13. The amplified microwave signal energy is then transmitted to an appropriate load 15 by way of ports 2 and 3 of the circulator.

Figure 2:
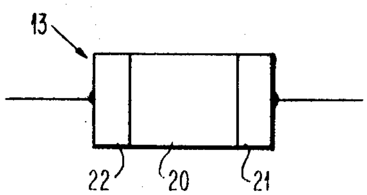
FIG. 2 is a schematic view of a bulk semiconductor device of the type included in the circuit of FIG. 1.

As shown by the schematic representation of FIG. 2 the semiconductor device 13 comprises a wafer 20 of bulk semiconductor material having on opposite sides only contacts 21 and 22. An appropriate differential negative resistance in the wafer results from a charged carrier transfer or population redistribution from a lower mobility band or from nonconducting energy levels of the medium to a higher mobility band. Energy bands here refers to either conduction bands or valence bands depending upon the charge of the current carriers. The bulk material of slab 20 should display the following characteristics for practical use as an amplifier. It should be a direct band gap material which does not show the Gunn effect. The wafer 20 can be prepared from one of the following *n*-type materials:

InSb, $Ga_xIn_{1-x}AS$, In $As_xP_{1-x}$, $In_{1-x}Al_xSb$, stressed *n* or *p* type Ge or stressed *p*-type Si. The band gap energy of this material should be in the range of about 0.5 ev. to about 0.7 ev.

Although bulk semiconductor oscillators are known, the amplifier of this invention is the first to achieve microamplification in which there is an initial positive differential conductivity In the Gunn effect devices or the traveling domain mode of operation of prior oscillators, negative differential conductivity is the underlying basis therefor.

THEORY OF THE INVENTION

The invention relates to a new type of high frequency bulk negative differential conductivity in a semiconductor material. Consider a uniform piece of semiconductor material to which there is applied a relatively strong steady electric field $E_0$, producing a steady current density $j_0$. The effect of a small alternating electric field $E_1(t)=E_1\cos\omega t$ superimposed on the steady field $E_0$ is found to produce a current density proportional to $E_1(t)$ which will be $j_1(t)$ having the form:

$$j_1(t)=j_1^r\cos\omega t+j_1^i\sin\omega t,$$

where $j_1^r$ is the magnitude of the in-phase current density and $j_1^i$ is the magnitude of the 90° out of phase current density. The ratio of $j_1^r$ to $E_1$ is called the real part of the differential conductivity (at bias field $E_D$ and frequency $\omega$) and is denoted by $\sigma_r'(\omega)$. Similarly the ratio of the out of phase current density $j_1^i$ to $E_1$ is called the imaginary part of the differential conductivity and is denoted by $\sigma_i'(\omega)$.

Figure 4:
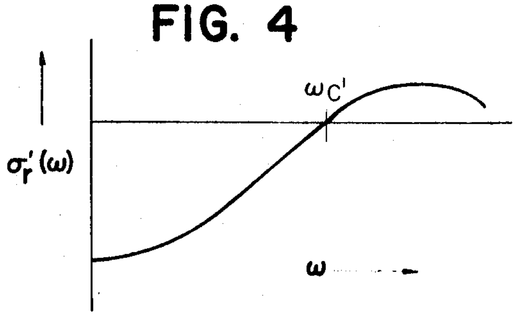
FIG. 4 is a graph depicting the relationship of the conductivity function $\sigma_r'(\omega)$ with frequency ($\omega$) for a Gunn device.

If a device is to be used as a bulk oscillator or amplifier at a frequency $\omega$, then it is necessary that $\sigma_r'69(\omega)$ be negative at that value of $\omega$. Materials which exhibit the Gunn effect, which depends on the transfer of electrons from a high mobility to a low mobility energy band have the dependence of $\sigma_r'(\omega)$ on $\omega$ shown in FIG. 4. Thus amplifying and oscillating devices can be constructed which operate at frequencies up to $\omega_c$, which for *n*-type gallium arsenide, the most commonly used Gunn effect material, is about $\omega_c'=2\pi\times10^{11}$ radians/sec as shown by reference. The transfer process from a high mobility to a low mobility energy band provides basically a static negative differential conductivity, that is, $\sigma_r'(\omega)$ is most negative at $\omega=0$, and as the frequency is raised and the electrons no longer respond instantaneously to the applied field, the differential conductivity becomes positive.

Figure 5:
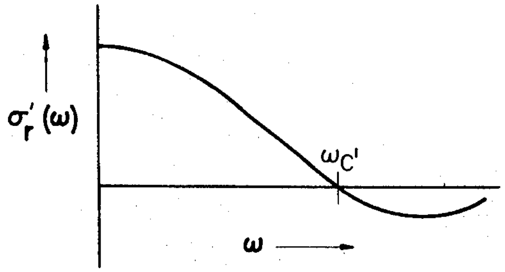
FIG. 5 is a graph depicting the relationship of the conductivity function $\sigma_r'(\omega)$ with frequency ($\omega$) for a device in accordance with this invention.

On the other hand, the devices of the present invention are formed of materials which have the following sort of dependence of $\sigma_r'(\omega)$ on $\omega$, shown in FIG. 5.

In this case the static processes provide a positive $\sigma_r(\omega)$ at $\omega=0$. At higher frequencies, where the fact that the electrons do not respond instantaneously to the electric field becomes important, $\sigma_r'(\omega)$ becomes negative, and it is at these high frequencies where the devices of the present invention will operate.

Basically, in order to have a negative $\sigma_r'(\omega)$ at any frequency $\omega$, it is necessary that the phase shift between the applied electric field and the current density exceed 90° For example where, 1. $E_1(t)=E_1\cos\omega t$ as before and,
2. $j_1(t)=j_1\cos(\omega t-\theta)$ where $j_1$ is the total magnitude of $j_1(t)$ and $\theta$ is the phase shift between the applied field and the resulting current density. Equating 2 can also be written as, $$j_1(t)=j_1\cos\theta\cos\omega t+j_1\sin\theta\sin\omega t$$

where we can now identify,

3. $j_1\cos\theta=j_1^r$
4. $j_1\sin\theta=j_1^i$

Clearly if $90°\leq\theta\leq270°$, $j_1^r$ is negative so that the in-phase current $j_1^r$ will flow in a direction opposite to E, and the wave at frequency $\omega$ will be amplified. Some semiconductor materials will have $\theta\geq90°$. As example of such a semiconductor material is InSb. If this material is doped slightly *n*-type, and we apply a sufficiently strong electric field, the electrons in the conduction band gain sufficient energy to promote additional electrons from the valence band to the conduction band. The rate at which the additional electrons are added to the conduction band depends on the average electron energy and on the recombination time of the excess electrons. This energy in turn contains an oscillating component $E_1\cos(\omega t-\theta_1)$ due to the oscillating electric field $E_1\cos\omega t$. Since the electric field only determines the rate of increase of the energy, $\theta_1$ can be as much as 90° at high frequencies. Since the rate of creation of excess carriers depends on the energy, it in turn will lag behind the energy, having the form.

5. $n_1(t)=n_1\cos(\omega t-\theta_1-\theta_2)$ and again $\theta_2$ can be as large as 90°. Thus $n_1$ will lag $E_1$ by an angle $\theta$ in excess of 90° whenever $\theta_1+\theta_2>90°$. The in-phase alternating current will have two terms, $$j_1^r=e(n_0v_1^r+v_0n_1^r)$$

Hence $n_1^r=n_1\cos(\theta_1+\theta_2)$, the first term represents the change in velocity of the steady-state number of electrons, and will never be negative in the materials we are considering. The second term, however, can be negative, since $V_0$ is positive and $n_1^r$ can be negative as we saw above. Hence, whenever $n_1$ is large enough and $\theta_1+\theta_2>90°$, $\sigma_r'(\omega)$ will be less than zero.

Figure 3:
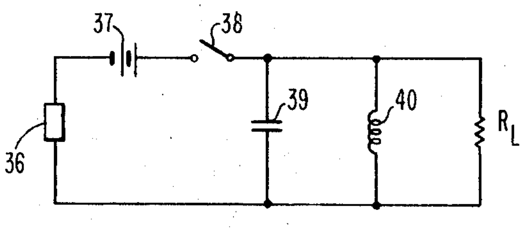
FIG. 3 is a schematic view of an oscillator circuit including a bulk semiconductor device, in accordance with another embodiment of the invention.

One realization of this model would be a bar of InSb or some other III—V compound or alloy which does not show the Gunn effect, doped slightly *n*-type and operated at a temperature sufficiently low, e.g., from about 77° K. to about 300° K. (dependent on the band gap) so that there are few intrinsic carriers. A steady field of a few hundred volts per cm., e.g., 200—400 V/cm. for InSb, is applied across the bar via two ohmic contacts, and the steady field provides a steady excess electron concentration which is smaller than the doping concentration. The sample is inserted into a cavity or wave guide structure, such as is shown in FIGS. 2 and 3, which contains the field $E_1\cos\omega t$ which is to be amplified to produce oscillations or just amplification.

An alternative to promoting electrons from the valence to the conduction bands is to promote them from a low mobility conduction band to a high mobility conduction band, for example, as in *n*-type germanium, compressed along a <111> direction with the steady field $E_0$ parallel to the compression direction, or uniaxially compressed *p*-type germanium or silicon with the steady field perpendicular to the compression, of from an impurity level within the forbidden gap of any reasonably high mobility semiconductor such as Cr doped GaAs. In the latter case, the threshold field for the new effect would be less than that for the Gunn effect, e.g. 1,000 V/cm. as compared to 3,500 V/cm.

Figure 6:
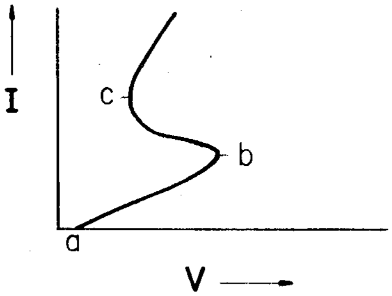
FIG. 6 is a graph showing the current voltage characteristics of a prior art current controlled negative resistance device.
Figure 7:
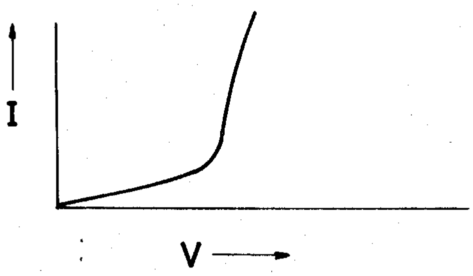
FIG. 7 is a graph showing the current voltage characteristics of a device according to this invention.

The phenomenon discussed above, must be distinguished from what is referred to as "current controlled negative resistance" which again is a static phenomenon. There the steady state current voltage characteristic has the shape shown in FIG. 6.

Where the region from *b* to *c* is referred to as a region of current controlled negative resistance, in the present invention there is no such region involved. The I—V curve in the steady state would look like that shown in FIG. 7 and the negative differential conductivity phenomenon is purely dynamic.

Referring to FIG. 3, there is shown schematically an oscillator circuit comprising a bulk semiconductor device 36 having the structure shown in FIG. 2 and the characteristic of charge carrier transfer from a lower mobility band to a higher mobility band, a DC voltage source 37, a switch 38, and a resonant circuit comprising a capacitance 39 and an inductance 40. The resonant circuit is tuned to be resonant at a frequency greater than $2\pi\times10^9$ radians/sec.

When switch 38 is closed, transients at the circuit frequency are amplified by the device, and fed back to the device to establish oscillation in the circuit. This oscillator may be preferred over known Gunn effect and current controlled negative resistance oscillators because higher frequencies of operation are available The materials used in the device of this invention can be made by any of the well-known solution growth techniques for preparing semiconductor materials. The materials can be grown in bulk or in epitaxial form.

Though the description of the invention has been directed to specific materials which exhibit a positive differential conductance at relatively low frequencies, it should be understood that the application of the inventive principles are not limited to these materials. Other semiconductor materials not showing the Gunn effect may also be employed.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In combination, a stable high frequency oscillating device comprising a bar of semiconductor material having energy bands that are separated by a relatively small energy and wherein a population redistribution of charge carriers occurs from the lower mobility states to higher mobility states of said two energy bands;

ohmic contacts spaced apart along the bar of semiconductor material;

means for applying a direct current bias field ($E_0$) to the contacts which is sufficiently high to establish a useful population redistribution in the two energy bands;

and means for applying an alternating field ($E_1$) between the ohmic contacts such that the differential conductivity $\sigma_r'(\omega)$ is positive at low frequencies and less than zero at high frequencies to thereby provide oscillation within said bar of semiconductor material.

2. A stable high frequency device according to claim 1 wherein said semiconductor material is selected from the group consisting of *n*-type InSb, *n*-type alloys of $In_xGa_{11x}as$, where $0.53<x<1.0$ $InAs_xP_{11x}$, where $0.30<x<1.0$, $In_xAl_{11x}Sb$, where $0.0<x\leq1.0$, stressed *n*-type germanium, stressed *p*-type germanium and stressed *p*-type silicon.

3. A stable high frequency device according to claim 1 wherein said semiconductor material is InSb.

4. A stable high frequency device according to claim 3 wherein a direct current bias voltage of about 200 to about 400 v/cms. is applied.

5. A stable high frequency device according to claim 1 wherein said device operates at a frequency greater than $2\pi\times 10^9$ radians/sec.

6. A stable high frequency device according to claim 1 wherein said device is operated at temperatures of about 77° K. to about 300° K.

7. A stable high frequency device according to claim 1 wherein said semiconductor material is an alloy of $In_xGa_{11x}As$, where $0.53<x<1.0$.

8. A stable high frequency device according to claim 1 wherein said semiconductor material is an alloy of $InAs_xP_{11x}$, where $0.3<x<1.0$.

9. A stable high frequency device according to claim 1 wherein said semiconductor material is an alloy of $In_xAl_{11x}Sb$, where $0.9<x\leq1.0$.

10. A stable high frequency device according to claim 1 wherein said semiconductor material is stressed *n*-type germanium, said *n*-type germanium being compressed in the direction of current flow along the <111> direction.

11. A stable high frequency device according to claim 1 wherein said semiconductor material is stressed *p*-type germanium, said *p*-type germanium being compressed perpendicular to the direction of current flow.

12. A stable high frequency device according to claim 1 wherein said semiconductor material is stressed *p*-type silicon, said *p*-type silicon being compressed perpendicular to the direction of current flow.

PO-1050
(5/69)

UNITED STATES PATENT OFFICE
CERTIFICATE OF CORRECTION

Patent No. 3,602,841 Dated August 31, 1971

Inventor(s) James C. McGroddy

It is certified that error appears in the above-identified patent and that said Letters Patent are hereby corrected as shown below:

In the Abstract, line 12 — Delete "$Ga_{11x}$" and substitute therefor -- $Ga_{1-x}$ -- line 13 — Delete "$Al_{11x}$" and substitute therefor -- $Al_{1-x}$ -- line 13 — Delete "$P_{11x}$" and substitute therefor -- $P_{1-x}$ --

Col. 3, line 1 — Delete "$In_{11x}$" and substitute -- $In_{1-x}$ --

Delete "$P_{11x}$" and substitute -- $P_{1-x}$ --

Second instance, delete "$In_{11x}$" and substitute -- $In_{1-x}$ -- line 30 — Delete "69"

Col. 5, line 32 — Delete "$Ga_{11x}$" and substitute -- $Ga_{1-x}$ -- line 33 — Delete "$P_{11x}$" and substitute -- $P_{1-x}$ --

Delete "$Al_{11x}$" and substitute -- $Al_{1-x}$ -- line 34 — Delete "0.0" and substitute -- 0.9 --

PO-1050
(5/69)

UNITED STATES PATENT OFFICE
CERTIFICATE OF CORRECTION

Patent No. 3,602,841 Dated August 31, 1971

Inventor(s) James C. McGroddy

It is certified that error appears in the above-identified patent and that said Letters Patent are hereby corrected as shown below:

Col. 6, line 14 Delete "$Ga_{11x}$" and substitute -- $Ga_{1-x}$ -- line 17 Delete "$P_{11x}$" and substitute -- $P_{1-x}$ -- line 20 Delete "$Al_{11x}$" and substitute -- $Al_{1-x}$ --

Signed and sealed this 3rd day of July 1973.

EAL)
test:

WARD M.FLETCHER,JR.
testing Officer

Rene Tegtmeyer
Acting Commissioner of Patents